United States Patent [19]

Honkanen

[11] Patent Number: 5,563,519

[45] Date of Patent: Oct. 8, 1996

[54] CIRCUIT AND METHOD FOR DETERMINING THE PHYSICAL POSITION OF A VARIABLE RESISTIVE DEVICE BETWEEN ITS MECHANICAL LIMITS

[75] Inventor: Matthew J. Honkanen, South Bend, Ind.

[73] Assignee: Environmental Technology, Inc., South Bend, Ind.

[21] Appl. No.: 430,905

[22] Filed: Apr. 27, 1995

[51] Int. Cl.$^6$ ................................................. G01R 31/26
[52] U.S. Cl. ......................... 324/676; 324/677; 324/678
[58] Field of Search .............................. 324/676, 207.21, 324/252, 609, 71.1, 699, 701, 659, 661, 679, 658, 677, 678; 338/32 R

[56] References Cited

PUBLICATIONS

Microchip Technology, Inc. *Embedded Control Handbook* (1994) pp. 2–65 to 2–69.

*Primary Examiner*—Michael Tokar
*Attorney, Agent, or Firm*—R. Tracy Crump

[57] ABSTRACT

A circuit and method is disclosed which determines the physical position of a selected resistance setting of a mechanical variable resistive component, such as a potentiometer, between its mechanical limits as a ratio of its selected resistance and its total resistance. The circuit includes a potentiometer, a capacitor and a microprocessor, which form a charging circuit. The microprocessor has three I/O pins, which are connected to the three terminals of the pot. The capacitor is connected in series to the pot, so that it can be charged by a voltage signal from the microprocessor either across the selected resistance of the pot's wiper or across the entire resistance of the pot. The microprocessor executes a program, which embodies the method of this invention. The program executed by the microprocessor enables the microprocessor to separately measure the time required to charge the capacitor to a predetermined threshold voltage first across the selected resistance and across the entire resistance of the device and then to generate the ratio of the two time intervals.

3 Claims, 5 Drawing Sheets

CIRCUIT AND METHOD FOR DETERMINING THE PHYSICAL POSITION OF A VARIABLE RESISTIVE DEVICE BETWEEN ITS MECHANICAL LIMITS

This invention to a circuit and method for determining the physical position of the selected resistance setting of mechanical variable resistive device, such as a potentiometer, between its mechanical limits as a ratio of its selected resistance and its total resistance.

BACKGROUND OF THE INVENTION

Variable resistance devices are commonly used in a variety of electrical circuits to provide an adjustable or selectable resistance. Potentiometers (pots) are common mechanically adjustable variable resistive devices. As commonly known in the electrical field, the physical position of the sliding contact or wiper along the length of the resistive coil determines the pot's selected resistance. Typically, the wiper is linked mechanically to a rotatable shaft. Turning the shaft selectively positions the wiper between the pot's clockwise rotational limit and its counterclockwise rotational limit to establish the resistance of the pot. In many applications, knowing the physical position of the wiper in relation to its mechanical limits is more important than the actual selected resistance of the pot.

Methodology and circuitry for determining the resistance for an unknown resistive device, such as the resistance setting of a potentiometer, are well known in the electrical arts. Typically the methodology consists of extrapolating a resistance for the unknown resistive device based on the known resistance of a calibrated resistive device. Fig. 1 shows a typical circuit using this conventional methodology. As shown, the circuit includes the unknown or measured resistive device Rm (such as a conventional potentiometer), a calibrated resistor Rc having a known resistance, a capacitor C, and a microprocessor MP, which provides a variety of programmed circuit functions and calculations. The known resistance of calibrated resistor Rc is stored in the memory of microprocessor MP. A reference voltage is applied across the known resistance of resistor Rc to charge capacitor C. Microprocessor MP measures the time interval to charge the capacitor from an initial voltage to a predetermine threshold voltage and stores that time interval. After capacitor C is discharged, the reference voltage is applied across unknown resistance of measured resistive device Rm to again charge capacitor C. Microprocessor MP measures the charging time interval across the unknown resistance of measured resistive device Rm and stores that time interval. Finally, microprocessor MP performs a calculation to generate a resistance for measured resistive device Rm by dividing the two charging time intervals and multiplying the ratio by the known resistance of calibrated resistor Rc.

The above circuitry and methodology can be employed with limited precision to determine the physical position of the selected setting of a mechanical variable resistive device between its mechanical limits, because the reading is subject to the inherent tolerance of the resistive device. The accuracy of the reading obtained by the conventional circuitry and methodology is directly tied to the tolerance of the resistive device itself. A more precise determination of the wiper's position can only be obtained by using a higher grade pot, which has a tighter tolerance. Consequently, a circuit and method for determining the physical position of a selected setting of a variable resistive device between its mechanical limits that is independent of the device's tolerance are desirable.

SUMMARY OF THE INVENTION

The circuit and method of this invention determines the physical position of a selected resistance setting of a mechanical variable resistive component, such as a potentiometer, between its mechanical limits as a ratio of its selected resistance and its total resistance. The circuit and method can generate a mapping of discrete physical positions for various resistance settings, which correspond to various percentages of the device's total resistance. The circuit and method enables a precise determination of the setting's physical position, regardless of the device tolerance and using a wide range of resistances. The circuit and method eliminate the need for a separate calibration resistive component.

The circuit of this invention includes a potentiometer, a capacitor and a microprocessor, which form a charging circuit. The microprocessor has three I/O pins, which are connected to the three terminals of the pot. The capacitor is connected in series to the pot, so that it can be charged by a voltage signal from the microprocessor either through the pot's wiper or through the entire pot. The microprocessor executes a program, which embodies the method of this invention. Preferably, the internal circuitry of the microprocessor includes a timer/counter, at least two multiple bit registers A and B, an arithmetic logic unit, and memory capacity for storing and executing a program which measures and calculates the ratio between the selected resistance and the total resistance of the pot. The program executed by the microprocessor enables the microprocessor to separately measure the time required to charge the capacitor to a predetermined threshold voltage first across the wiper arm of the pot and then across the entire pot and then calculate the ratio between the two time intervals.

Accordingly, an advantage of the circuit and method of this invention is to enable a determination of the physical position of a selected setting of a mechanical variable resistive device between its mechanical limits as a ratio of the selected resistance to the total resistance of the resistive device.

Another advantage of the circuit and method of this invention is that the accuracy of the position determination made by the circuit and method is independent of the tolerance of the variable resistive device.

Another advantage of the circuit and method of this invention is to enable the elimination of the calibration resistive device needed in the conventional methodology.

Other advantages will become apparent upon a reading of the following description.

BRIEF DESCRIPTION OF THE DRAWINGS

A preferred embodiment of the invention has been depicted for illustrative purposes only wherein.

DESCRIPTION OF THE PREFERRED EMBODIMENT

The preferred embodiment herein described is not intended to be exhaustive or to limit the invention to the precise form disclosed. It is chosen and described to best explain the invention so that others skilled in the art might utilize its teachings.

Figure 1:
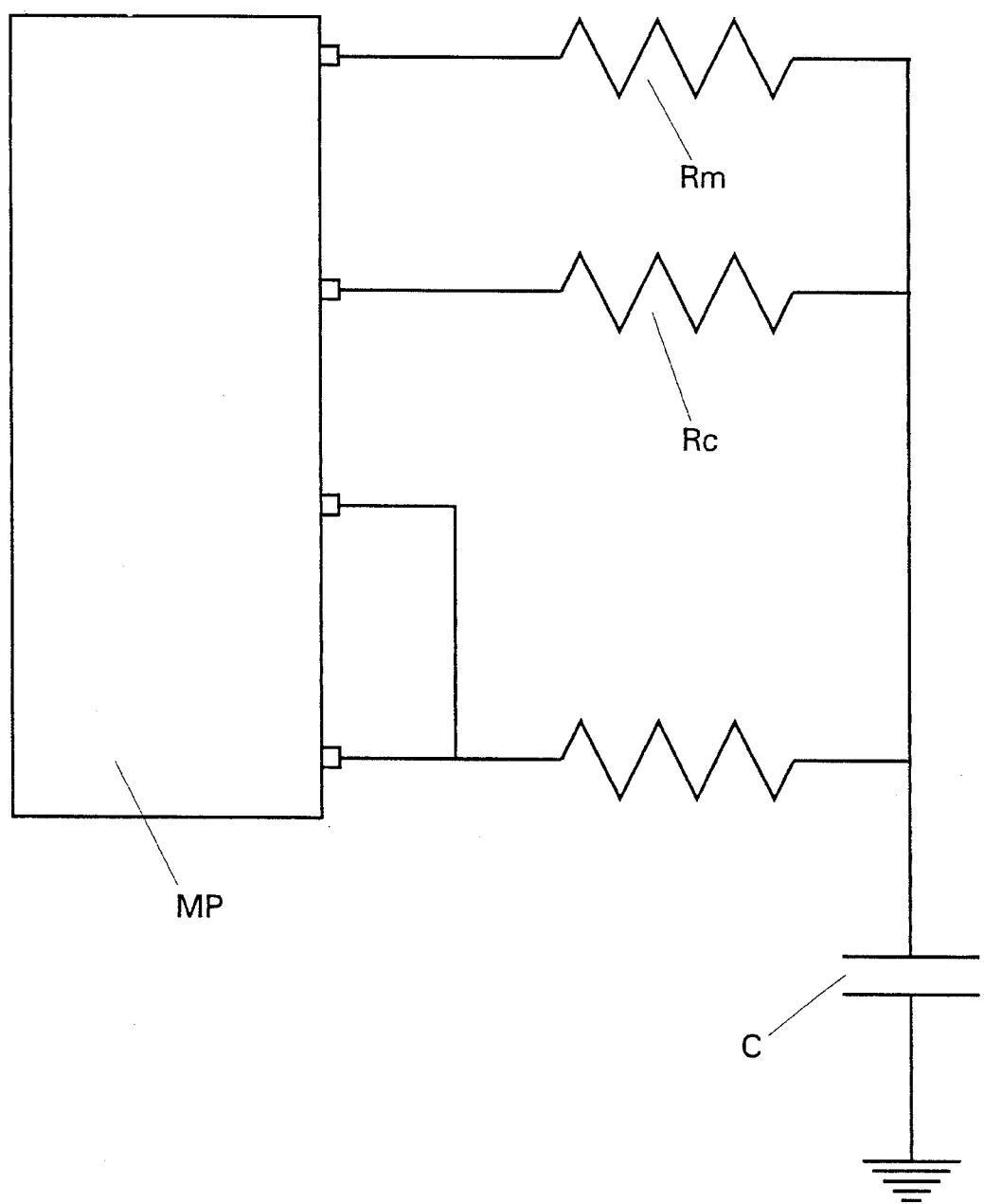
FIG. 1 is a simplified schematic of a typical charging circuit using the conventional method for determining the resistance of an unknown resistive device.
Figure 2:
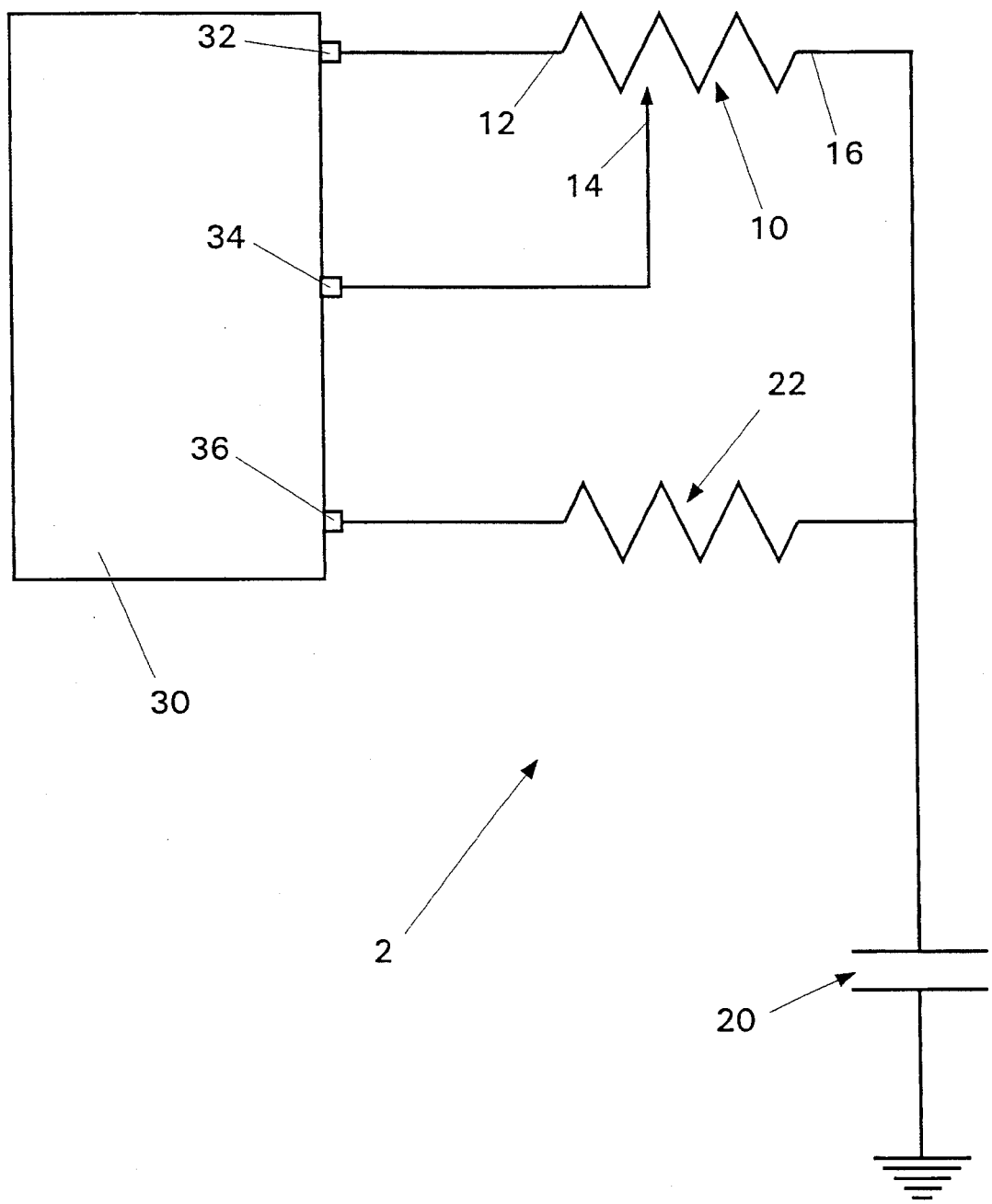
FIG. 2 is a simplified schematic of the circuit of this invention for determining the physical position of a potentiometer's wiper between its mechanical limits as a ratio of the selected resistance and the total resistance of the potentiometer.

FIG. 2 shows a simplified schematic of the time capacitive charging circuit 2 of this invention, which provides a precise determination of the physical position of a selected setting of a mechanical variable resistive device (a potentiometer) between its mechanical limits as a ratio of its selected resistance and its total resistance. Circuit 2 includes a potentiometer 10 (the variable resistive device), a resistor 22, a capacitor 20 and a microprocessor 30. In circuit 2, microprocessor 30 executes a program 50 which embodies the method of this invention by performing a variety of internal functions and calculations, that one skilled in the electronics art would recognize could be accomplished by a variety of other circuit components without narrowing or changing the scope and teachings of this invention. Preferably, the internal circuitry of microprocessor 30 includes a timer/counter, at least two multiple bit registers A and B, an arithmetic logic unit, and memory capacity for storing and executing a program 50. An example of such a microprocessor would be one of the PIC16C5X series of microprocessors, which are commercially available from Microchip Technology, Inc. of Chandler Ariz.

As shown in FIG. 2, microprocessor 30 has at least three I/O pins 32, 34, 36. Pot 10 is of conventional design and includes terminals 12, 14, and 16 with terminal 14 being the wiper terminal. Pot terminal 12 is connected to I/0 pin 32. Wiper terminal 14 is connected to I/O pin 34. Pot terminal 16 is connected to I/O pin 36 across resistor 22, which limits the current into microprocessor 30 when pin 36 is an output to prevent damage to the microprocessor. Capacitor 20 is connected between pot terminal 16 and ground.

Figure 3:
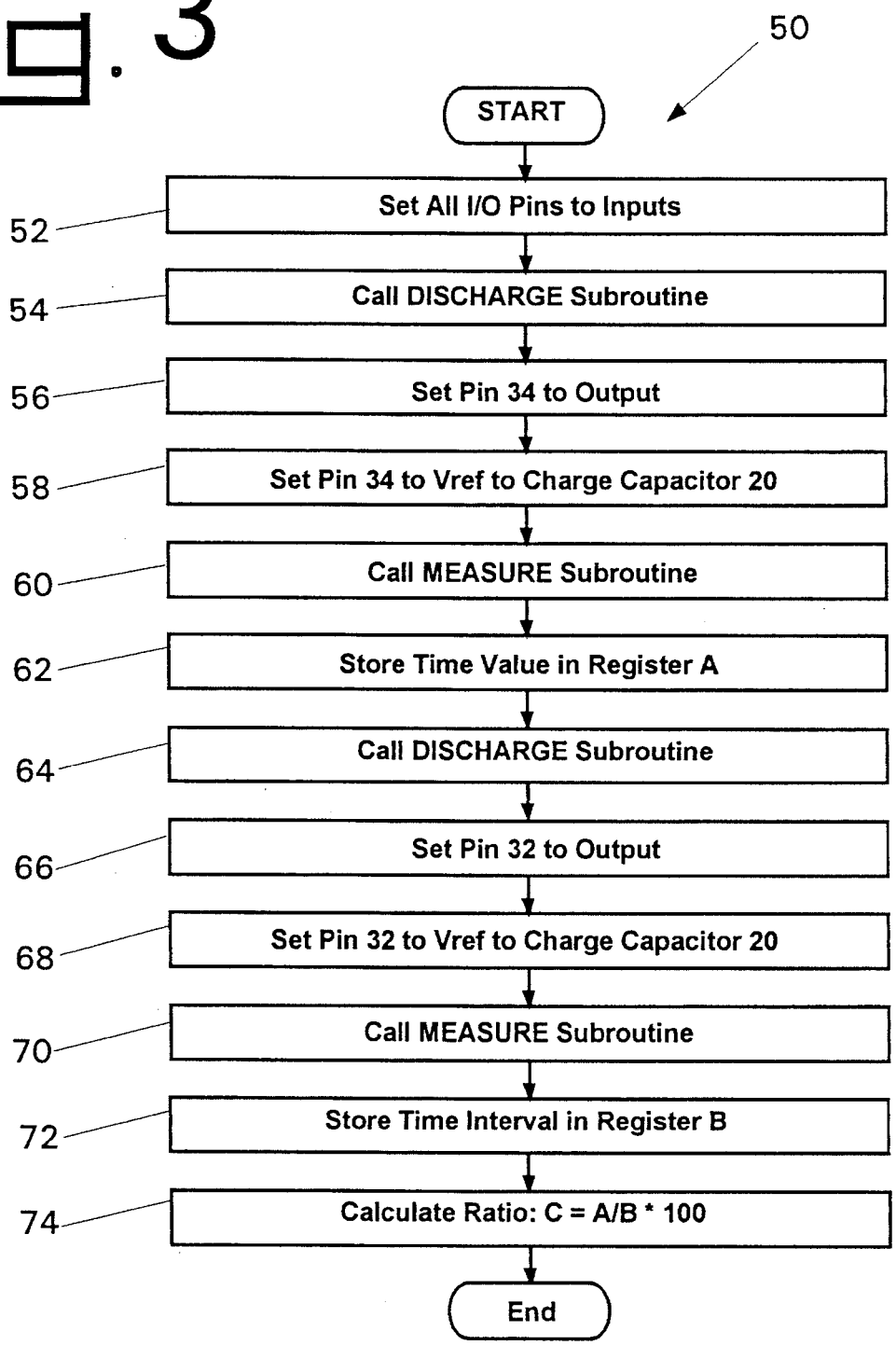
FIG. 3 is a flow chart of the program executed by the microprocessor in FIG. 1 and embodying the method of this invention.

FIG. 3 shows a basic flow chart of the program 50 used by microprocessor 30 to execute the circuit functions of this invention. Program 50 begins by setting all I/O pins as inputs (process block 52). Next, program 50 calls a "DISCHARGE" subroutine 80.

Figure 4:
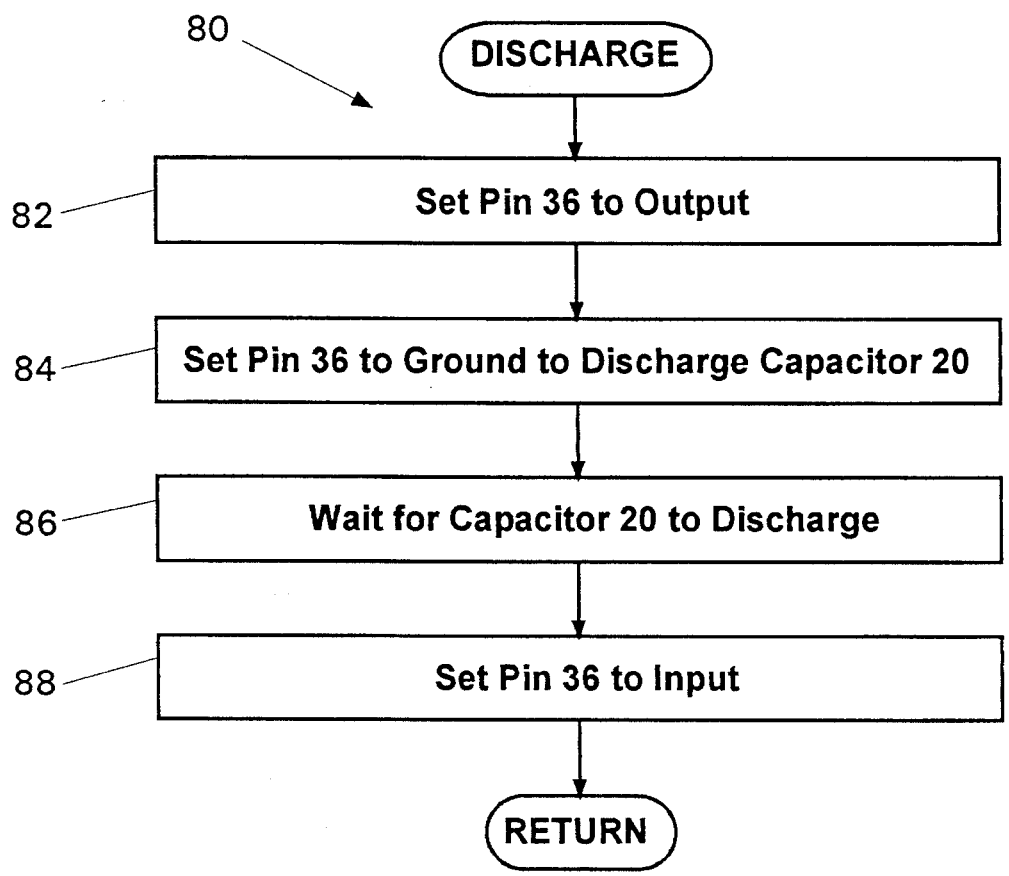
FIG. 4 is a flow chart of a subroutine used by the program of FIG. 3.

DISCHARGE subroutine 80 allows capacitor 20 to discharge to a predetermined floor voltage, preferably, ground potential. As shown in FIG. 4, DISCHARGE subroutine 80 sets pin 36 to an output (process block 82). Next, DISCHARGE subroutine 80 sets pin 36 to ground, which discharges capacitor 20 (process block 84). DISCHARGE subroutine 80 waits for capacitor 20 to discharge to ground or some initial low voltage level (process block 86). After capacitor 20 is discharged, DISCHARGE subroutine 80 sets pin 36 back to an input (process block 88) and returns to program 50.

Once control returns from DISCHARGE subroutine 80, program 50 changes I/O pin 34 from an input to an output (process block 54) and sets its output signal to a reference voltage $V_{ref}$ (process block 58). The voltage signal from pin 34 begins charging capacitor 20 through wiper terminal 14 and pot terminal 16. Once pin 34 is set to the reference voltage $V_{ref}$, program 50 immediately calls a "MEASURE" subroutine 90.

Figure 5:
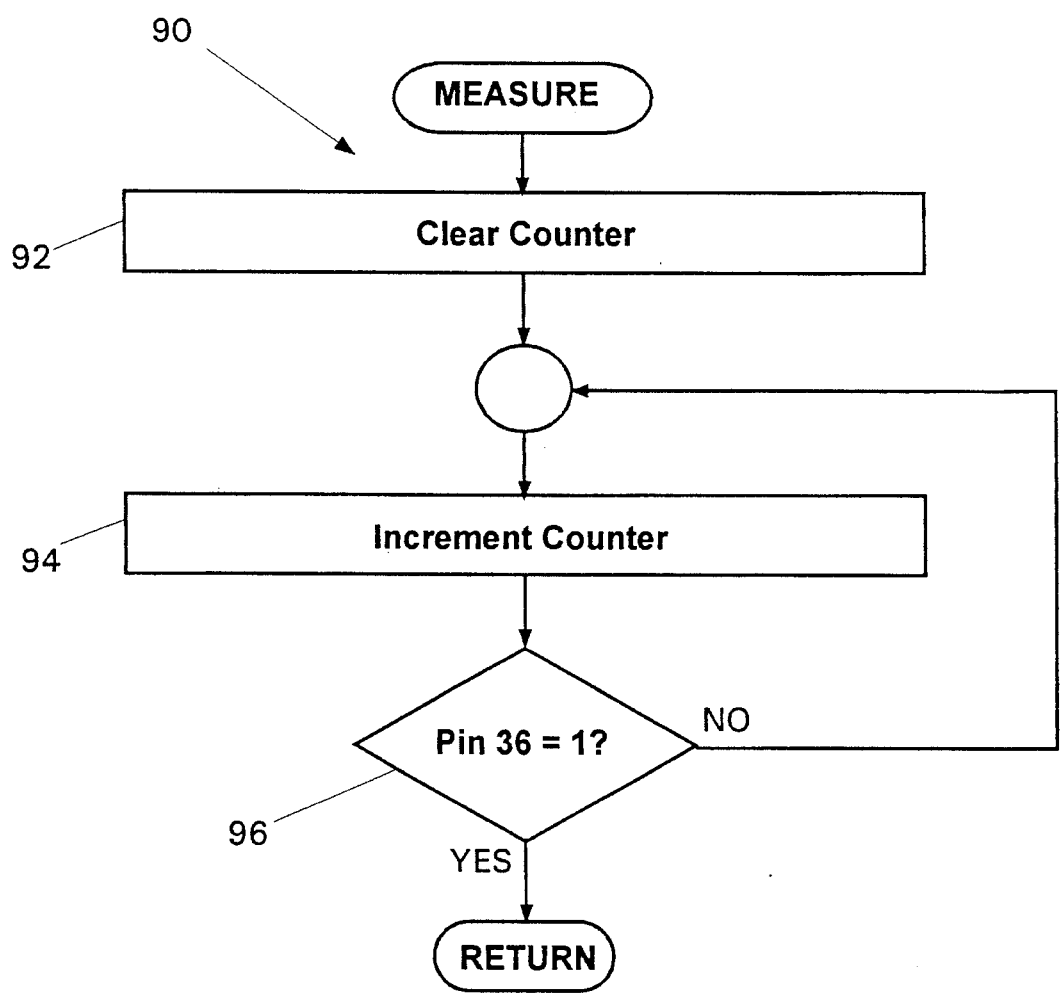
FIG. 5 is a flow chart of another subroutine used by the program of FIG. 3.

MEASURE subroutine 90 measures the time that capacitor 20 charges before reaching a predetermined ceiling or threshold voltage. As shown in FIG. 5, MEASURE subroutine 90 clears the timer/counter (process block 92). Next, MEASURE subroutine 90 increments the timer/counter (process block 94). Next, MEASURE subroutine 90 tests to determine if pin 36 is high, i.e., logic one, or low, i.e., logic zero (decision block 96). If pin 36 is low, MEASURE subroutine 90 loops back to process block 74 and increments the timer/counter. Once pin 36 is high, MEASURE subroutine 90 returns to program 50.

Once control returns from MEASURE subroutine 90, program 50 stores the time interval obtained from the timer/counter during the MEASURE subroutine to register A (process block 62). Next, program 50 recalls DISCHARGE subroutine 80 to again discharge capacitor 20 (process block 64). Next, program 50 changes I/O pin 32 from an input to an output (process block 66) and sets its output to the reference voltage $V_{ref}$ (process block 68). The voltage signal from pin 32 begins charging capacitor 20 through pot terminals 12 and 16. Once pin 32 is set to the reference voltage Vref, program 50 immediately recalls MEASURE subroutine 90 to measure a second charging time (process block 70). Next, program 50 stores the time interval obtained from the timer/counter during the MEASURE subroutine in register B (process block 72). Finally, program 50 divides the time interval in register A into the time interval in register B and multiplies the result by 100 (process block 74).

The value generated from circuit 2 program 50 represents the physical location of the wiper setting between its mechanical limits, irrespective of its actual resistance. Consequently, the circuit and method can generate a mapping of discrete physical positions for various resistance settings, which corresponds directly to the various percentages of the device's total resistance. The linearity of this mapping is only related to the linearity of the resistive device.

It is understood that the above description does not limit the invention to the details given, but may be modified within the scope of the following claims.

I claim:

1. An electrical circuit connected to a mechanically adjustable variable resistive device for determining the physical position of a selected resistance setting for said resistive device between its mechanical limits as a ratio of the selected resistance to the total resistance of said resistive device, said circuit comprising:

capacitance means connected to said resistive device, charging means connected to said resistive device for applying a reference voltage signal to said capacitance means to charge said capacitance means from a first voltage to a second voltage in a first mode through the selected resistance of said resistive device and in a second mode across the total resistance of said resistive device, means for measuring the time interval for charging said capacitance means from a first voltage to said second voltage during said first charging mode and said second charging mode, means for dividing said time interval of said first charging mode by said time interval of said second charging mode to generate said ratio.

2. An electrical circuit connected to a potentiometer including a mechanically positionable wiper, said circuit for determining the physical position of said wiper between its mechanical limits as a ratio of the selected resistance of said potentiometer and the total resistance of said potentiometer, said circuit comprising:

capacitor connected to said potentiometer, charging means connected to said potentiometer for applying a reference voltage signal to said capacitor to charge said capacitor from a first voltage to a second voltage in a first mode across said selected resistance of said potentiometer and in a second mode across the total resistance of said potentiometer, means for measuring the time interval for charging said capacitor from a first voltage to said second voltage during said first charging mode and said second charging mode, means for dividing said time interval of said first charging mode by said time interval of said second charging mode to generate said ratio.

3. A method for determining the physical position of the selected resistance setting of a mechanically adjustable variable resistive device between its mechanical limits as a ratio of the selected resistance to the total resistance of said resistive device, comprising the steps of:

a) providing a capacitance connected to said resistive device;

b) applying a reference voltage across said total resistance of said resistive device to charge said capacitance from a first voltage to a second voltage;

c) measuring the time interval to charge said capacitance from said first voltage to said second voltage during step (b);

d) applying said reference voltage across said selected resistance of said resistive device to charge said capacitance from said first voltage to said second voltage;

e) measuring the time interval to charge said capacitance from said first voltage to said second voltage during step (d);

f) dividing the time interval of said step (c) by the time interval of said step (e) to generate said ratio of the selected resistance to the total resistance of said resistive device.

* * * * *